United States Patent
Choi et al.

(10) Patent No.: US 7,920,977 B2
(45) Date of Patent: Apr. 5, 2011

(54) NONCONTACT MEASUREMENT METHOD OF CURRENTS ON SUPERCONDUCTIVE WIRES CONNECTED IN PARALLEL

(75) Inventors: Kyeong Dal Choi, Seoul (KR); Ji Kwang Lee, Wanju-gun (KR); Seung Wook Lee, Cheongju-si (KR); Chan Park, Seoul (KR); Woo Seok Kim, Seoul (KR)

(73) Assignee: Korea Polytechnic University, Jeongwang-dong, Siheung-si, Gyeonggi-do (KR)

( * ) Notice: Subject to any disclaimer, the term of this patent is extended or adjusted under 35 U.S.C. 154(b) by 418 days.

(21) Appl. No.: 12/043,802

(22) Filed: Mar. 6, 2008

(65) Prior Publication Data
US 2009/0105973 A1 Apr. 23, 2009

(30) Foreign Application Priority Data
Oct. 17, 2007 (KR) .......................... 10-2007-0104504

(51) Int. Cl.
  *G01R 19/00* (2006.01)
  *H01L 39/24* (2006.01)
  *G01R 27/00* (2006.01)
(52) U.S. Cl. ............. 702/64; 702/65; 505/160; 505/310
(58) Field of Classification Search .............. 702/64–84, 702/121–123, 181–190
See application file for complete search history.

(56) References Cited

U.S. PATENT DOCUMENTS
6,571,183 B1 * 5/2003 Wellstood et al. .............. 702/65
2002/0149331 A1 * 10/2002 Marcinkiewicz ............. 318/254
* cited by examiner

*Primary Examiner* — Andrew Schechter
*Assistant Examiner* — Phuong Huynh
(74) *Attorney, Agent, or Firm* — John K. Park; Park Law Firm

(57) ABSTRACT

A noncontact method for measuring currents flowing through superconductive wires connected in parallel is provided. The method includes arranging hall sensors for measuring voltage levels based on magnetic fields generated around the superconductive wires, setting a matrix relation between the measured voltage values, values of currents flowing through the superconductive wires, and a variable matrix having variables defining relations between the voltage values and the current values, applying predetermined current levels to the superconductive wires a number of times and measuring voltage values through the hall sensors, substituting the predetermined current values and the measured voltage values into the matrix relation to calculate the variables of the variable matrix, and substituting the calculated variable matrix and unknown voltage values, measured by the hall sensors when unknown currents flow through the superconductive wires, into the matrix relation to calculate values of the unknown currents flowing through the superconductive wires.

4 Claims, 8 Drawing Sheets

NONCONTACT MEASUREMENT METHOD OF CURRENTS ON SUPERCONDUCTIVE WIRES CONNECTED IN PARALLEL

BACKGROUND OF THE INVENTION

1. Field of the Invention

The present invention relates to a noncontact measurement method, and more particularly to a noncontact measurement method which can measure currents flowing through a plurality of superconductive wires connected in parallel using hall sensors in a noncontact manner.

2. Description of the Related Art

After the introduction of a superconductive wire or a High Temperature Superconductor (HTS) wire, intensive studies have been made to develop power-related equipment using the superconductive wire.

In contrast to general power equipment using copper, superconductive power equipment requires a cooling facility to maintain the characteristics of the superconductive wire. Thus, in order to achieve superconductive power equipment, which is economically efficient compared to general power equipment, it is necessary to develop wires which can be applied to highly efficient, large-capacity power equipment.

The use of wires, each including multiple superconductive wires connected in parallel, to manufacture large-capacity power equipment has been suggested taking into consideration the fact that the threshold current of a second generation superconductive wire, which is currently under study, is less than about 250 A. Among a variety of superconductive wires developed until now, a 1 cm-wide YBCO wire which has been recently developed has the threshold current of about 280 A. However, a number of superconductive wires must be connected in parallel to be used for large-capacity high-temperature, superconductive power equipment since the large-capacity power equipment requires currents of hundreds or thousands of Ampere.

When a coil is manufactured using a wire constructed by connecting superconductive wires in parallel, which will be referred to as a "parallel wire", the levels of each current flowing through each superconductive wire included in the parallel wire may not be uniform due to different impedances of each superconductive wire.

Such unbalance-distribution of current throughout the parallel wires causes a reduction in the conductive current that can flow through the parallel wire and an increase in the AC loss. Thus, in order to increase the conductive current and to decrease the AC loss, it is necessary to make the distribution of current throughout the superconductive wires included in the parallel wire uniform.

SUMMARY OF THE INVENTION

In order to make the distribution of current throughout the superconductive wires included in the parallel wire uniform, it is necessary to previously determine whether or not currents on the parallel wire are uneven.

Therefore, the present invention has been made in view of the above circumstances, and it is an object of the present invention to provide a noncontact method for measuring the levels of currents flowing through superconductive wires included in a parallel wire in a noncontact manner, thereby making it possible to determine whether or not currents on the parallel wire are uneven.

In accordance with the present invention, the above and other objects can be accomplished by the provision of a noncontact method for measuring currents flowing through a plurality of superconductive wires connected in parallel, the method comprising the steps of a) arranging a plurality of hall sensors for measuring voltage levels based on magnetic fields generated around the plurality of superconductive wires; b) setting a matrix relation between the voltage levels measured by the hall sensors, levels of currents flowing through the superconductive wires, and a variable matrix having a plurality of variables defining relations between the voltage levels and the current levels; c) applying preset current levels to the plurality of superconductive wires a plurality of times and measuring voltage levels through the plurality of hall sensors; d) substituting the preset current levels and the voltage levels measured through the plurality of hall sensors into the matrix relation to calculate respective values of the variables of the variable matrix; and e) substituting the variable matrix calculated at the step d) and a plurality of unknown voltage levels, measured by the plurality of hall sensors when unknown currents flow through the superconductive wires, into the matrix relation to calculate respective levels of the unknown currents flowing through the superconductive wires.

Preferably, the matrix relation is expressed by the following equation:

$$\begin{bmatrix} V_1 \\ V_2 \\ V_3 \\ \vdots \\ \vdots \\ \vdots \\ V_n \end{bmatrix} = \begin{bmatrix} K_{11} & K_{12} & K_{13} & \ldots & K_{1n} \\ K_{21} & K_{22} & K_{23} & \ldots & K_{2n} \\ K_{31} & K_{32} & K_{33} & \ldots & K_{3n} \\ \vdots & \vdots & \vdots & \ldots & \vdots \\ \vdots & \vdots & \vdots & \ldots & \vdots \\ \vdots & \vdots & \vdots & \ldots & \vdots \\ K_{n1} & K_{n2} & K_{n3} & \ldots & K_{nn} \end{bmatrix} \begin{bmatrix} I_1 \\ I_2 \\ I_3 \\ \vdots \\ \vdots \\ \vdots \\ I_n \end{bmatrix},$$

where n represents the number of the superconductive wires connected in parallel, $V_k$ (k=1, 2, 3, ..., n) represents voltage levels measured by the hall sensors, $I_k$ (k=1, 2, 3, ..., n) represents current levels flowing through the superconductive wires, and $K_{ij}$ (i=1, 2, 3, ..., n, j=1, 2, 3, ..., n) represents the variables in the variable matrix.

Preferably, the plurality of superconductive wires include 4 superconductive wires that are arranged at upper and lower left and right sides, respectively, in transverse cross-section, and the step a) includes arranging 4 hall sensors respectively near the 4 superconductive wires that are arranged at the upper and lower left and right sides.

Preferably, the plurality of superconductive wires are twisted into a Roebel bar shape, and the step a) includes arranging the plurality of hall sensors outside the plurality of superconductive wires having the Roebel bar shape at positions respectively near the plurality of superconductive wires.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will now be described in detail with reference to the accompanying drawings.

Figure 1:
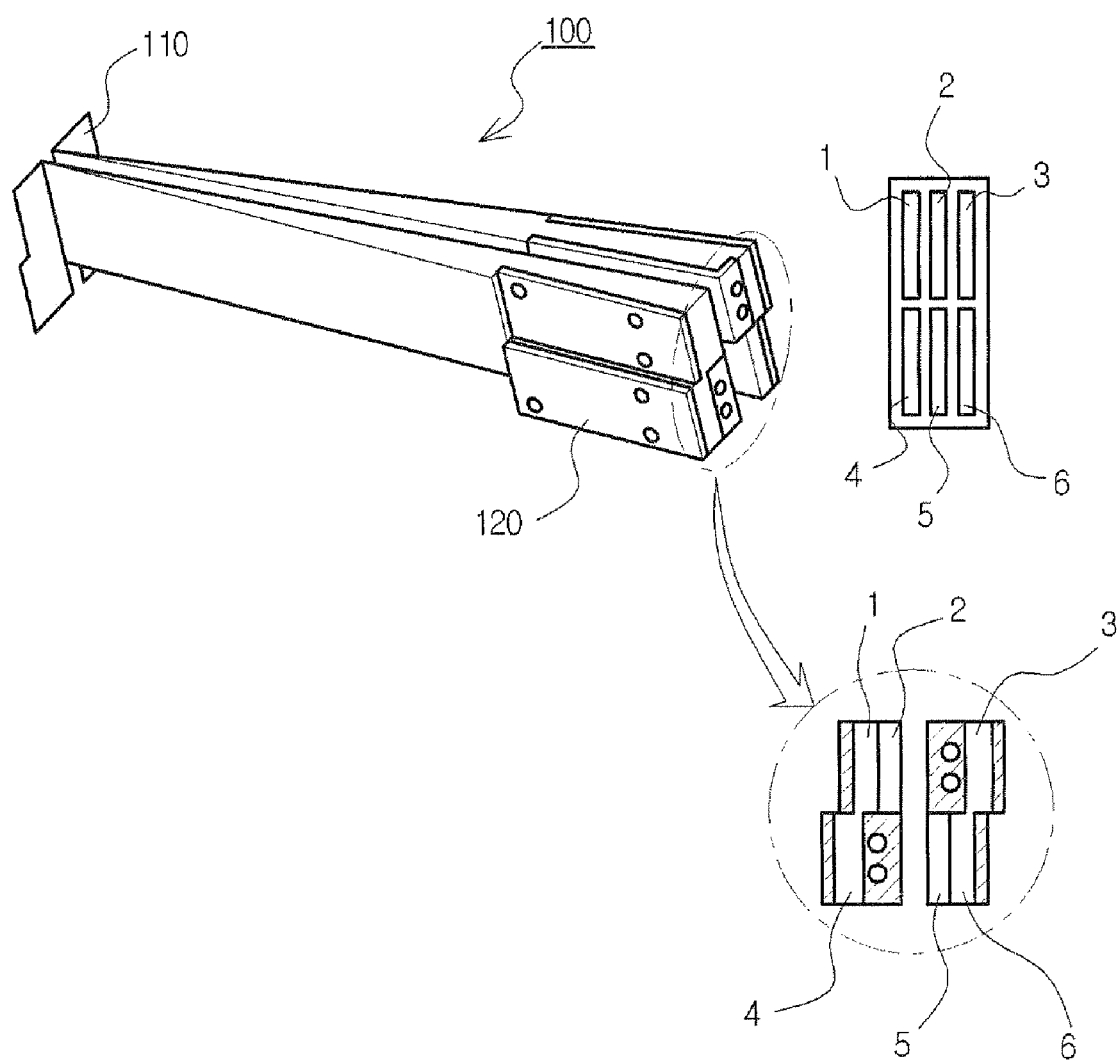
FIG. 1 illustrates an example in which a parallel wire is constructed using 6 superconductive wires.

First, we will show electrical characteristics about unbalance-currents on a parallel wire before describing the non-contact measurement method according to the present invention. The following description will be given for an example where 6 superconductive wires are used to construct a parallel wire. As shown in FIG. 1, in order to control and measure current values of the 6 superconductive wires 1, 2, 3, 4, 5, and 6 included in the parallel wire 100, one end of each of the 6 superconductive wires 1, 2, 3, 4, 5, and 6 is commonly connected to a copper terminal 110 and the other ends are separated using a holder 120 to be connected respectively to 6 copper terminals (not shown).

Table 1 shows the specifications of the superconductive wires 1, 2, 3, 4, 5, and 6 used for the parallel wire 100 shown in FIG. 1.

TABLE 1

| SUPERCONDUCTIVE WIRE (BSCCO-2223) | area | 4.1 mm |
|---|---|---|
| | thickness | 0.31 mm |
| | threshold current | 126 A (at 77K, 0 T) |
| SUPERCONDUCTIVE PARALLEL WIRE | number of wires | 6 |
| | insulator | Kapton tape |

In order to allow uniform currents to flow through the parallel wire 100 including the 6 superconductive wires 1, 2, 3, 4, 5, and 6 shown in FIG. 1, the superconductive wires 1, 2, 3, 4, 5, and 6 are electrically insulated from each other and each contact resistances thereof are uniform. However, different contact resistances occur between the superconductive wires 1, 2, 3, 4, 5, and 6 and the copper terminal 110 when the superconductive wires 1, 2, 3, 4, 5, and 6 are connected to the copper terminal 110.

Although the different contact resistances are small, they cause different values of currents to flow through the superconductive wires 1, 2, 3, 4, 5, and 6. Therefore specific resistors (for example, 1.0Ω resistors) are connected to the ends of the superconductive wires 1, 2, 3, 4, 5, and 6 so that current is distributed uniformly throughout the superconductive wires 1, 2, 3, 4, 5, and 6. Also, a distance of a voltage tap to measure the threshold current is set to 10 cm and the measurement is carried out on the basis of 1 μV/cm.

Figure 2:
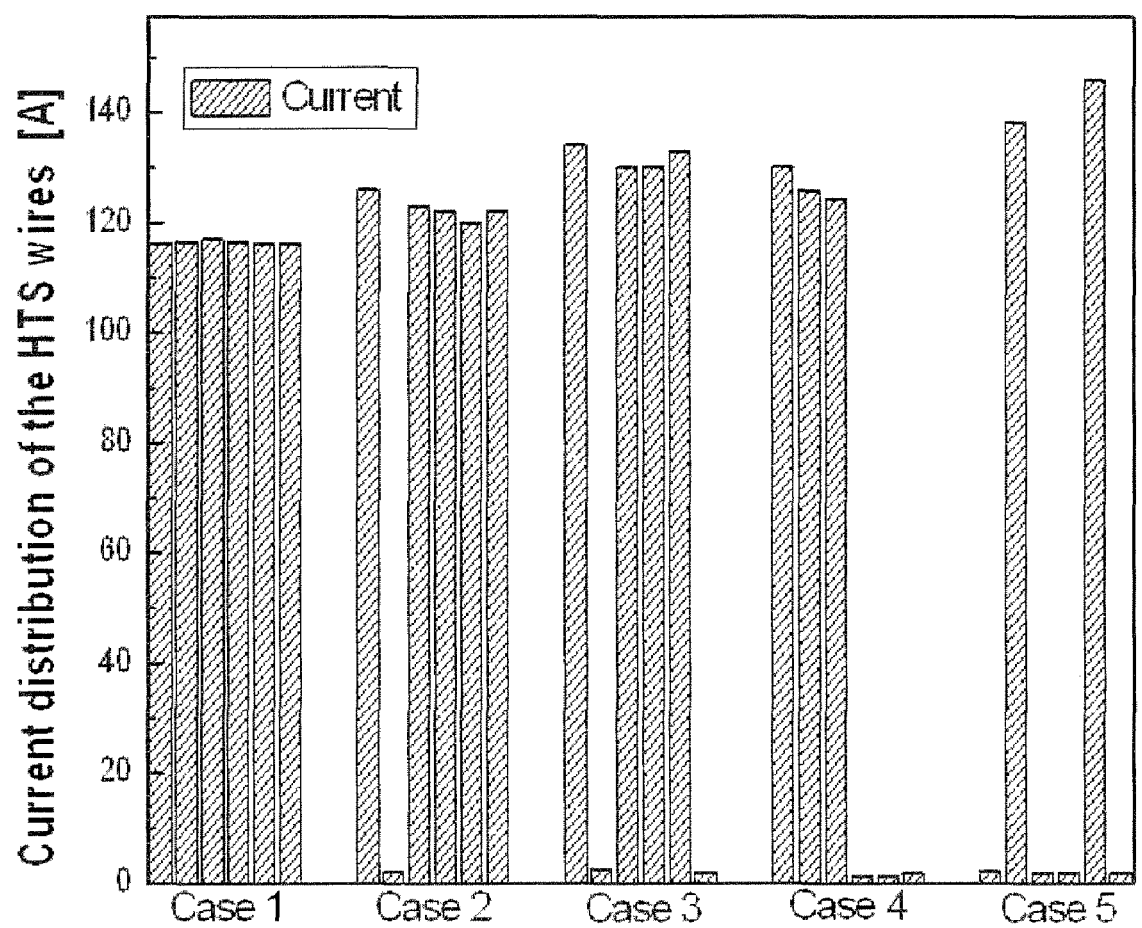
FIGS. 2 and 3 are graphs showing experimental results using the parallel wire shown in FIG. 1.

The threshold current and an AC loss are measured in the condition where the values of currents are not uniform through the configuration described above. First, in the condition where current is distributed uniformly throughout the superconductive wires 1, 2, 3, 4, 5, and 6, resistors are sequentially connected to the superconductive wires 1, 2, 3, 4, 5, and 6 to form 4 cases where the values of currents on the superconductive wires 1, 2, 3, 4, 5, and 6 are not uniform. Ones of the superconductive wires 1, 2, 3, 4, 5, or 6, through which current flows for each case, are determined as shown in Table 2 in which the reference numbers of the superconductive wires 1, 2, 3, 4, 5, and 6 shown in FIG. 1 are written for each case to indicate the superconductive wires 1, 2, 3, 4, 5, or 6 through which current flows. FIG. 2 shows the measured values of the threshold current flowing through the superconductive wires 1, 2, 3, 4, 5, and 6 in the 5 conditions shown in Table 2.

TABLE 2

| | superconductive wires through which current flows |
|---|---|
| Case 1 | 1, 2, 3, 4, 5, 6 |
| Case 2 | 1, 3, 4, 5, 6 |
| Case 3 | 1, 3, 4, 5 |
| Case 4 | 1, 2, 3 |
| Case 5 | 2, 5 |

If current flows through the superconductive wires 1, 2, 3, 4, 5, and 6, AC magnetic fields are generated inside and outside the superconductive wires 1, 2, 3, 4, 5, and 6. The Ac magnetic fields induce electric fields in the superconductive wires 1, 2, 3, 4, 5, and 6, thereby causing transport current losses. Such transport current losses can be calculated using flat model and elliptical model suggested by Norris. We calculated the losses of the BSCCO wires using the elliptical model. The AC losses were calculated using a Norris equation expressed as follows.

$$P(F) = \frac{\mu_0 I_c^2 f}{\pi}\left[(1-F)\ln(1-F) + (2-F)\frac{F}{2}\right] \quad \text{[Equation 1]}$$

Figure 3:
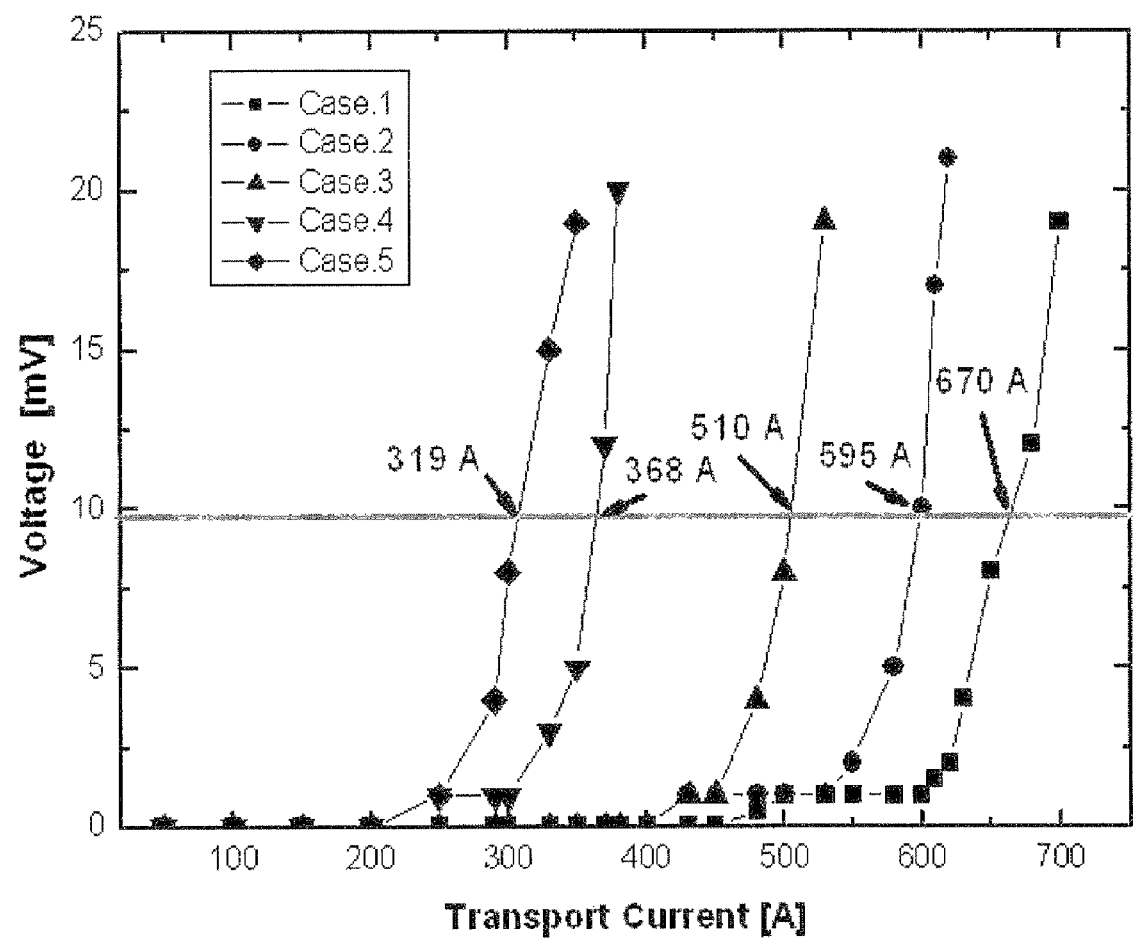
Figure 4:
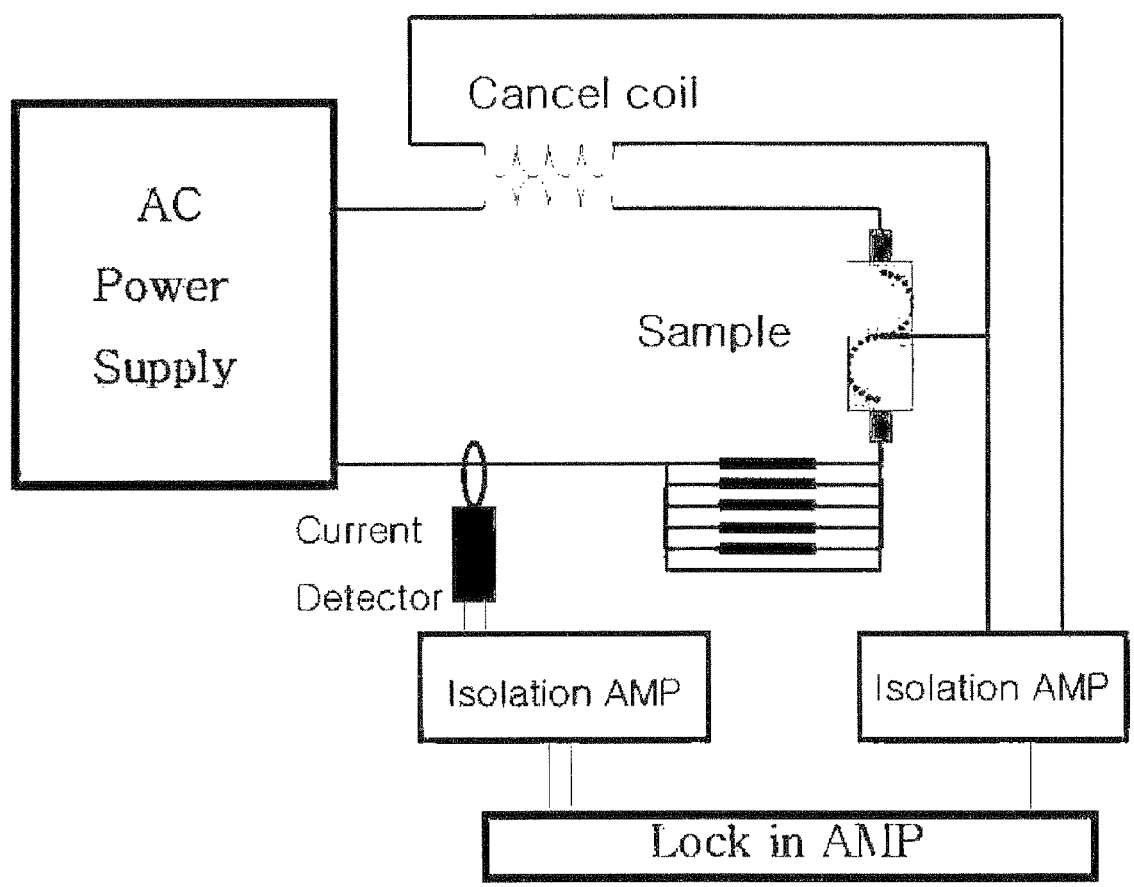
FIG. 4 illustrates an example circuit for measuring AC losses.
Figure 5:
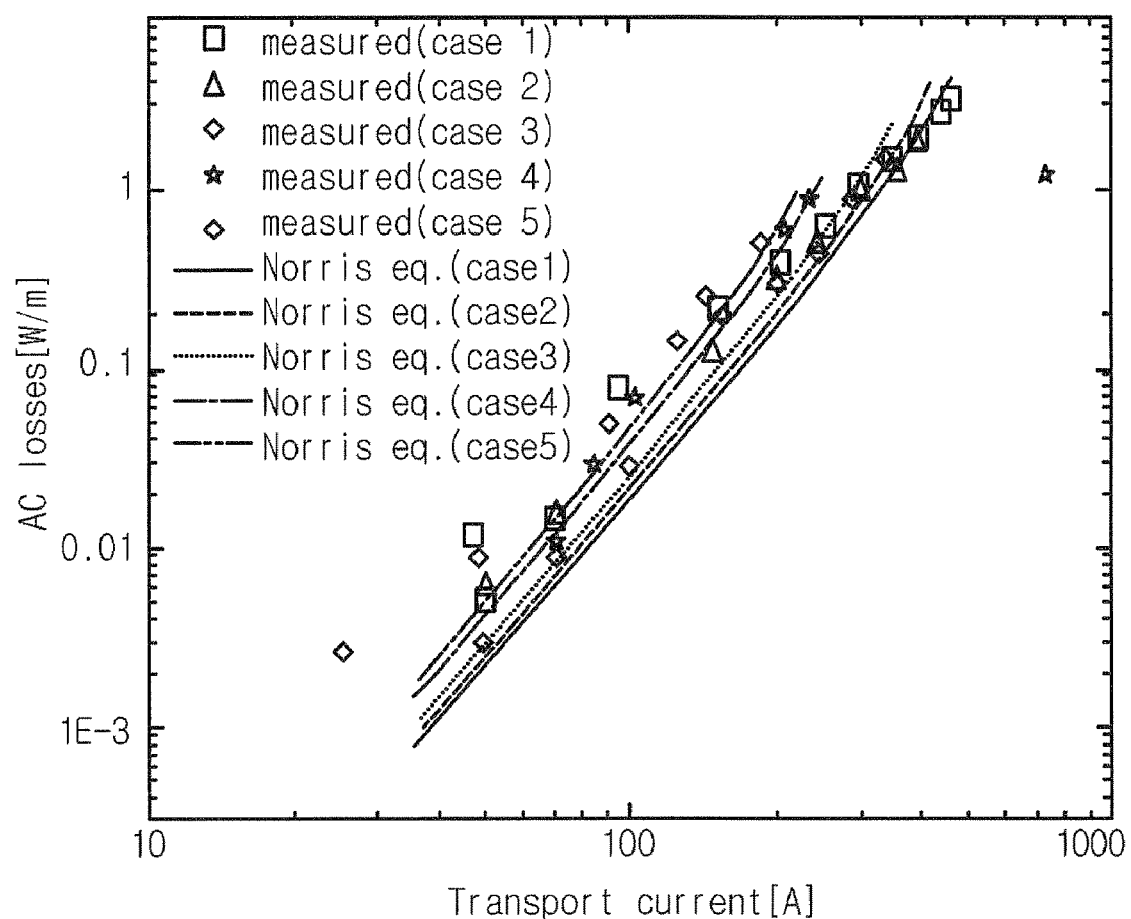
FIG. 5 shows measured and calculated current losses when the distribution of current in the parallel wire is uniform and when the current distribution is not uniform in each condition.

FIG. 3 shows experimental results with the conditions and theories described above, which specifically shows measured values of the threshold current when the current distribution is uniform and when the current distribution is not uniform, and FIG. 4 shows the configuration of a circuit for measuring AC losses. FIG. 5 shows measured and calculated current losses when the current distribution is uniform and when the current distribution is not uniform in each case.

Reference will now be made in detail to the noncontact measurement method according to the present invention to measure the current flowing through the plurality of superconductive wires 1, 2, 3, 4, 5, and 6 connected in parallel (i.e., the parallel wire 100 constructed as described above) using the electrical characteristics of unbalance-currents in the parallel wire 100 confirmed through the method described above.

Figure 6:
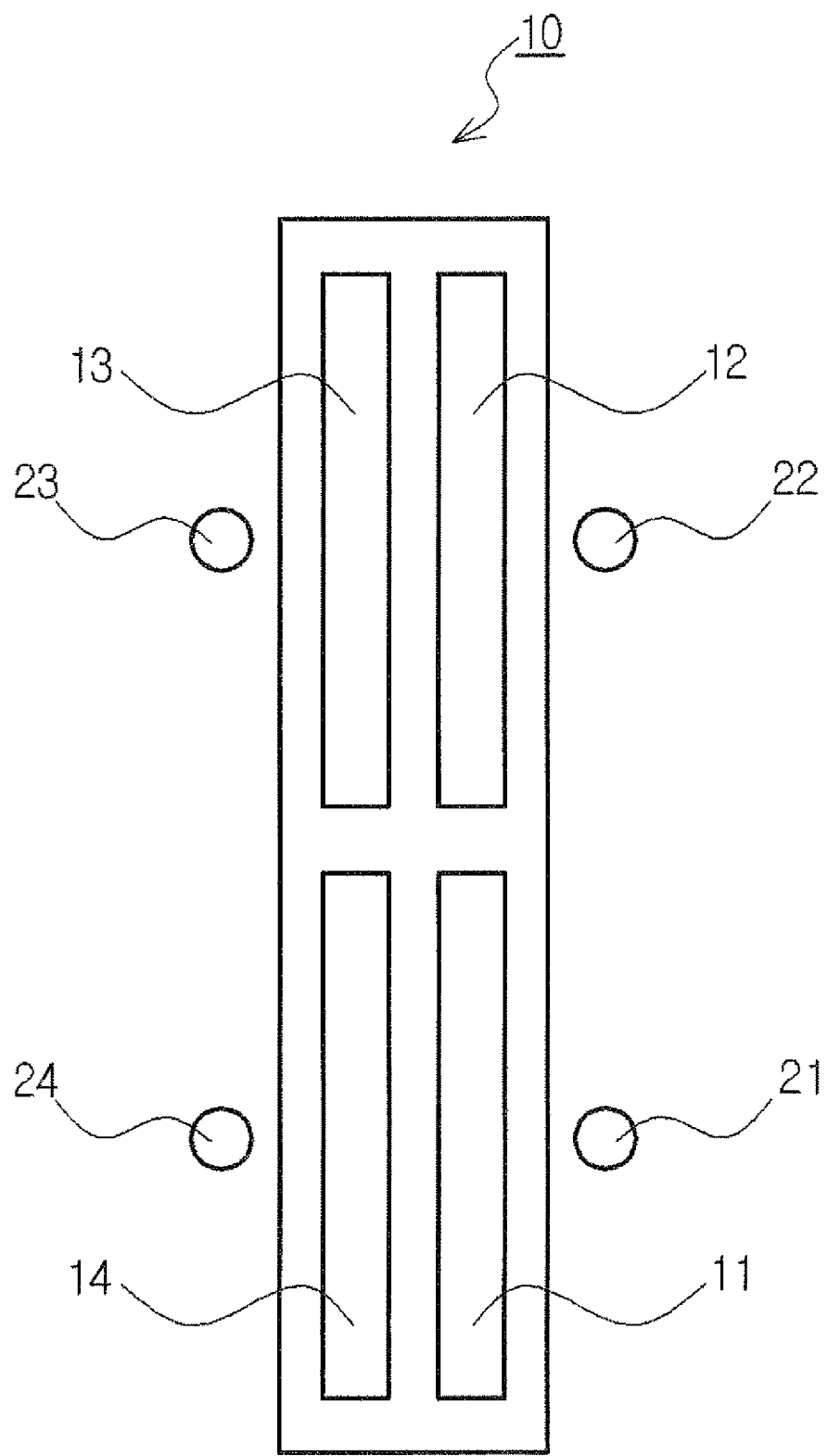
FIGS. 6 to 8 illustrate embodiments of the structure of a parallel wire and the arrangement of hall sensors.

As shown in FIG. 6, a plurality of hall sensors 21, 22, 23, and 24 are arranged to measure voltages based on magnetic fields generated around superconductive wires 11, 12, 13, and 14. In the example of FIG. 6, the 4 superconductive wires 11, 12, 13, and 14 are arranged at the upper and lower left and right sides, respectively, in the transverse cross-section of the superconductive wires 11, 12, 13, and 14 and the 4 hall sensors 21, 22, 23, and 24 are arranged respectively near the 4 superconductive wires 11, 12, 13, and 14 that are arranged at the upper and lower left and right sides.

When current flows through the superconductive wires 11, 12, 13, and 14, magnetic fields are generated around the superconductive wires 11, 12, 13, and 14. Here, the magnitude of the generated magnetic field is proportional to the level of the current. The hall sensors 21, 22, 23, and 24 measure magnetic fields generated around the superconductive wires 11, 12, 13, and 14. Specifically, the magnitudes of the magnetic fields measured by the hall sensors 21, 22, 23, and 24 are converted into corresponding voltage values. Thus, the relations between the voltage values measured by the hall sensors 21, 22, 23, and 24 and the values of currents flowing through the superconductive wires 11, 12, 13, and 14 may be expressed by a following matrix relation equation.

$$[V]=[K][I] \quad \text{[Equation 2]}$$

Here, V is a matrix representing the voltage values measured by the hall sensors 21, 22, 23, and 24, I is a matrix representing the values of currents flowing through the superconductive wires 11, 12, 13, and 14, and K is a variable matrix having variables defining the relations between the voltage values and the current values.

[Equation 2] can be expressed by the following equation 3 when the parallel wire 10 including the 4 superconductive wires 11, 12, 13, and 14 are arranged with the 4 hall sensors 21, 22, 23, and 24 corresponding to the 4 superconductive wires 11, 12, 13, and 14 as shown in FIG. 6.

$$\begin{bmatrix} V_1 \\ V_2 \\ V_3 \\ V_4 \end{bmatrix} = \begin{bmatrix} K_{11} & K_{12} & K_{13} & K_{14} \\ K_{21} & K_{22} & K_{23} & K_{24} \\ K_{31} & K_{32} & K_{33} & K_{34} \\ K_{41} & K_{42} & K_{43} & K_{44} \end{bmatrix} \begin{bmatrix} I_1 \\ I_2 \\ I_3 \\ I_4 \end{bmatrix} \quad \text{[Equation 3]}$$

[Equation 4] is a more general form of [Equation 3].

$$\begin{bmatrix} V_1 \\ V_2 \\ V_3 \\ \vdots \\ \vdots \\ \vdots \\ V_n \end{bmatrix} = \begin{bmatrix} K_{11} & K_{12} & K_{13} & \ldots & K_{1n} \\ K_{21} & K_{22} & K_{23} & \ldots & K_{2n} \\ K_{31} & K_{32} & K_{33} & \ldots & K_{3n} \\ \vdots & \vdots & \vdots & \ldots & \vdots \\ \vdots & \vdots & \vdots & \ldots & \vdots \\ \vdots & \vdots & \vdots & \ldots & \vdots \\ K_{n1} & K_{n2} & K_{n3} & \ldots & K_{nn} \end{bmatrix} \begin{bmatrix} I_1 \\ I_2 \\ I_3 \\ \vdots \\ \vdots \\ \vdots \\ I_n \end{bmatrix} \quad (4)$$

Here, n represents the number of superconductive wires connected in parallel, $V_k$ (k=1, 2, 3, ..., n) represents voltage values measured by hall sensors, $I_k$ (k=1, 2, 3, ..., n) represents current values flowing through the superconductive wires, and $K_{ij}$ (i=1, 2, 3, ..., n, j=1, 2, 3, ..., n) represents variables in the variable matrix.

With the matrix relation equation as shown in [Equation 3] being set, predetermined currents values (hereinafter, represented as 'measurement current values') are applied to the superconductive wires 11, 12, 13, and 14 a plurality of times and voltage values (hereinafter, represented as 'measurement voltage values') are measured by the hall sensors 21, 22, 23, and 24. For example, the measurement voltage values is measured by the hall sensors 21, 22, 23, and 24 in the condition that the measurement current value (for example, a 60 A current) is applied to one of the 4 superconductive wires 11, 12, 13, and 14 (for example, the superconductive wire 11) and no current flows through the remaining superconductive wires 12, 13, and 14. Then, the variables of the variable matrix may be calculated in the manner that the measurement current value is sequentially applied to the 3 superconductive wires 12, 13, and 14 and no current flows through the remaining superconductive wires.

The variables of the variable matrix may also be calculated by applying the various measurement current values to the superconductive wires 11, 12, 13, and 14.

After the variable matrix of the matrix relation equation has been calculated as described above, in the state that unknown values of currents, which currently flow through the superconductive wires 11, 12, 13, and 14 after current is applied to the parallel wire 10 such that the applied current is distributed throughout the superconductive wires 11, 12, 13, and 14, may be calculated using the calculated variable matrix and unknown voltage values that the hall sensors 21, 22, 23, and 24 measure while the unknown values of currents flow through the superconductive wires 11, 12, 13, and 14. Accordingly, the values of currents flowing through the superconductive wires 11, 12, 13, and 14 when power is applied to the parallel wire 10 can be measured in a noncontact manner, thereby making it possible to determine whether or not the values of currents flowing through the superconductive wires 11, 12, 13, and 14 included in the parallel wire 10 are uniform.

In the example described above with reference to FIG. 6, the parallel wire 10 is constructed of the 4 superconductive wires 11, 12, 13, and 14 that are arranged at the upper and lower left and right sides, respectively, in the transverse cross-section of the superconductive wires 11, 12, 13, and 14. In another example where a parallel wire 10a is constructed of a plurality of superconductive wires 11a, 12a, 13a, and 14a, trapezoidal superconductive wires 11a, 12a, 13a, and 14a may be twisted to construct a Roebel bar-shaped parallel wire 10a as shown in FIG. 7.

In this example, hall sensors 21, 22, 23, and 24 may be arranged at positions, near the superconductive wires 11a, 12a, 13a, and 14a included in the Roebel bar-shaped parallel wire 10a, at which the hall sensors 21, 22, 23, and 24 can optimally measure magnetic fields generated by the superconductive wires 11a, 12a, 13a, and 14a as shown in FIGS. 8A and 8B. FIG. 8A shows an example where hall sensors 21, 22, 23, and 24 are arranged near the diagonally winding surfaces of trapezoidal superconductive wires 11a, 12a, 13a, and 14a included in a Roebel bar-shaped parallel wire 10a and FIG. 8B shows an example where hall sensors 21, 22, 23, and 24 are arranged around a Roebel bar-shaped parallel wire 10a near their respective superconductive wires 11a, 12a, 13a, and 14a.

Figure 7:
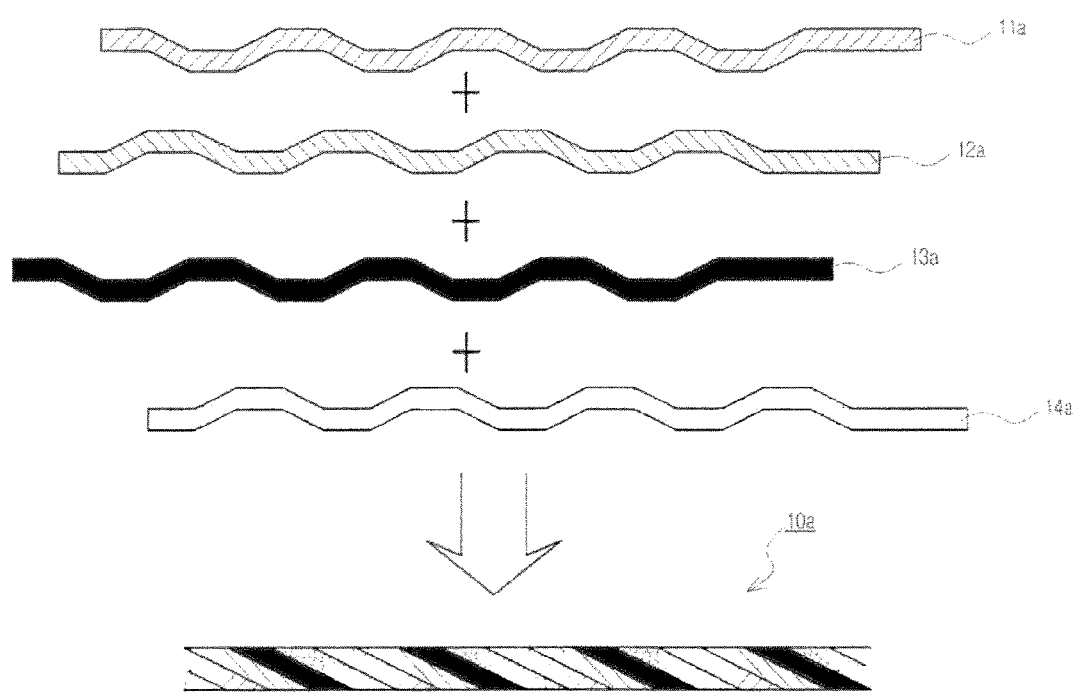
Figure 8:
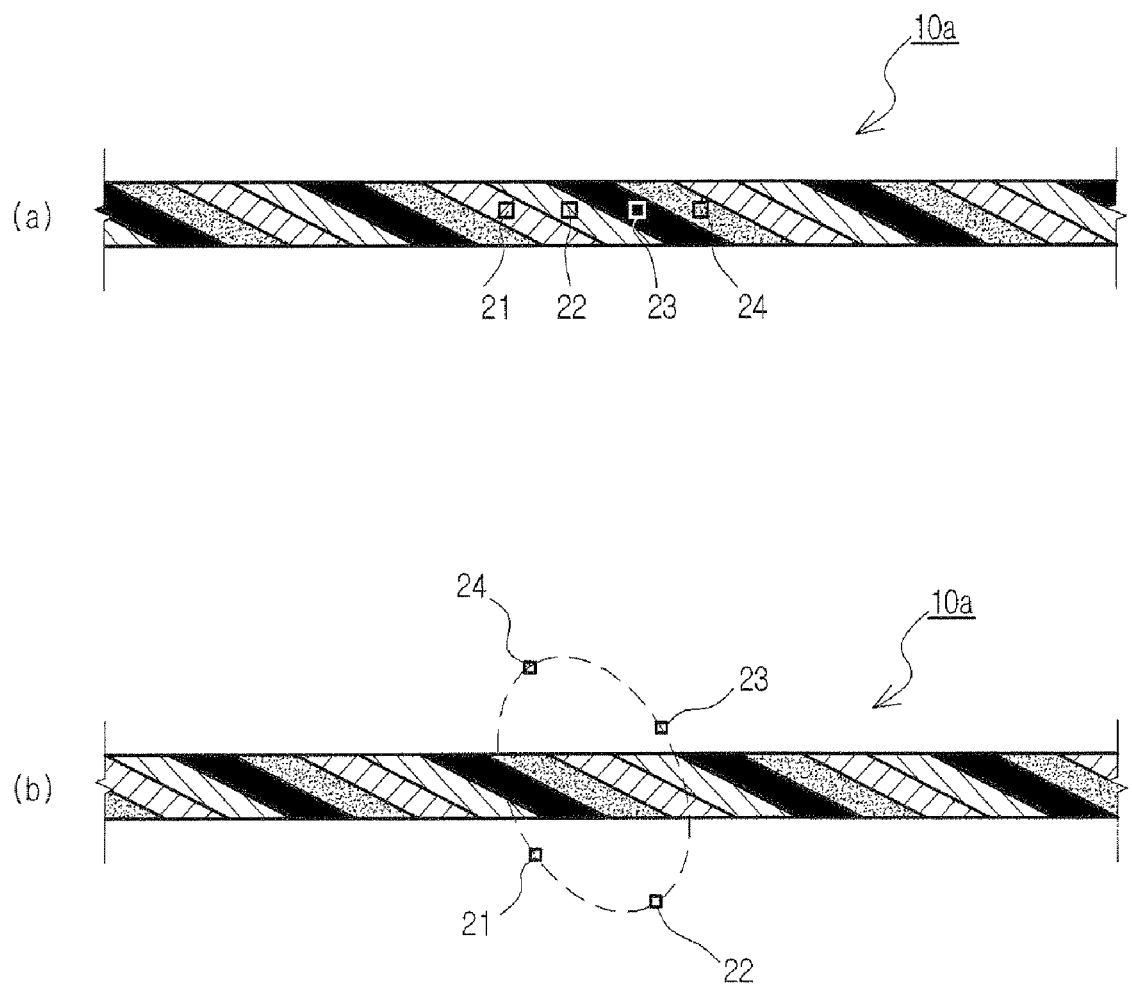

The Roebel bar-shaped parallel wire 10a can also be constructed using 5 or more superconductive wires although the Roebel bar-shaped parallel wire 10a is constructed using the 4 superconductive wires 11a, 12a, 13a, and 14a in the example of FIGS. 7 and 8.

The arrangement of the hall sensors 21, 22, 23, and 24 can also be determined by experimentally determining positions of the hall sensors 21, 22, 23, and 24 at which they can most accurately measure the values of currents flowing through the superconductive wires, according to the structure of the parallel wire, through experiments in various conditions of the structure of the parallel wire.

As is apparent from the above description, the present invention provides a noncontact method for measuring the values of currents flowing through superconductive wires included in a parallel wire in a noncontact manner, thereby making it possible to determine whether or not uneven currents flow through the parallel wire.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A noncontact measurement method of a plurality of superconductive wires connected in parallel, the noncontact measurement method comprising steps of:
   (a) arranging a plurality of hall sensors for measuring voltage values based on magnetic fields generated around the plurality of superconductive wires;
   (b) inputting and saving a matrix relation equation between the voltage values measured by the hall sensors, current values of currents flowing through the superconductive wires, and a variable matrix having a plurality of variables defining relations between the voltage values and the current values;
   (c) applying predetermined measurement current values to the plurality of superconductive wires a plurality of times and measuring and saving measurement voltage values corresponding to the measurement current values through the plurality of hall sensors;

(d) calculating the variables of the variable matrix by substituting the measurement current values and the measurement voltage values into the matrix relation equation saved; and e) calculating and outputting unknown current values of unknown currents flowing through the superconductive wires by substituting a plurality of unknown voltage values measured by the plurality of hall sensors when the unknown currents flow through the superconductive wires and the variable matrix calculated at the step (d) into the matrix relation equation.

2. The noncontact measurement method according to claim 1, wherein the matrix relation equation is expressed by the following equation:

$$\begin{bmatrix} V_1 \\ V_2 \\ V_3 \\ \vdots \\ \vdots \\ \vdots \\ V_n \end{bmatrix} = \begin{bmatrix} K_{11} & K_{12} & K_{13} & \ldots & K_{1n} \\ K_{21} & K_{22} & K_{23} & \ldots & K_{2n} \\ K_{31} & K_{32} & K_{33} & \ldots & K_{3n} \\ \vdots & \vdots & \vdots & \ldots & \vdots \\ \vdots & \vdots & \vdots & \ldots & \vdots \\ \vdots & \vdots & \vdots & \ldots & \vdots \\ K_{n1} & K_{n2} & K_{n3} & \ldots & K_{nn} \end{bmatrix} \begin{bmatrix} I_1 \\ I_2 \\ I_3 \\ \vdots \\ \vdots \\ \vdots \\ I_n \end{bmatrix},$$

where n represents the number of the superconductive wires connected in parallel, Vk (k=1, 2, 3, ..., n) represents voltage values measured by the hall sensors, Ik (k=1, 2, 3, ..., n) represents current values flowing through the superconductive wires, and Kj (i=1, 2, 3, ..., n, j=1, 2, 3, ..., m) represents the variables in the variable matrix.

3. The noncontact measurement method according to claim 2, wherein the plurality of superconductive wires include 4 superconductive wires that are arranged at upper and lower left and right sides, respectively, in transverse cross-section, and 4 hall sensors are arranged near the 4 superconductive wires that are arranged at the upper and lower left and right sides, respectively, in the step (a).

4. The noncontact measurement method according to claim 2, wherein the plurality of superconductive wires having a Roebel bar shape formed by being twisted each other, and the plurality of hall sensors are arranged outside the plurality of superconductive wires having the Roebel bar shape at positions respectively near the plurality of superconductive wires.

* * * * *